United States Patent
Takenaka (10) Patent No.: US 6,614,311 B2
(45) Date of Patent: Sep. 2, 2003

(54) MICRO-WAVE POWER AMPLIFIER (75) Inventor: Isao Takenaka, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 09/998,686

(22) Filed: Nov. 29, 2001

(65) Prior Publication Data
US 2002/0067212 A1 Jun. 6, 2002

(30) Foreign Application Priority Data
Dec. 1, 2000 (JP) ........................................ 2000-366517

(51) Int. Cl.[7] .............................. H03F 3/04; H03F 1/00
(52) U.S. Cl. ........................ 330/302; 330/306; 330/65
(58) Field of Search .......................... 330/65, 302, 306

(56) References Cited

U.S. PATENT DOCUMENTS

| | | | |
|---|---|---|---|
| 4,093,919 A | * 6/1978 | Watanabe | 455/142 |
| 4,107,612 A | * 8/1978 | Leveque | 455/125 |
| 5,263,197 A | * 11/1993 | Manjo et al. | 455/324 |
| 5,808,531 A | * 9/1998 | Nakano | 334/15 |

FOREIGN PATENT DOCUMENTS

TW 511330 11/2002 ........... H03F/3/189

* cited by examiner

*Primary Examiner*—Patricia T. Nguyen
(74) *Attorney, Agent, or Firm*—Hayes Soloway P.C.

(57) ABSTRACT

A micro-wave power amplifier which amplifies a micro-wave signal including a plurality of carrier frequencies different from one another, includes (a) a field effect transistor having a grounded source, (b) a first difference frequency circuit which is electrically connected to a drain of the field effect transistor, and is short-circuited at a difference frequency between the carrier frequencies, and (c) a second difference frequency circuit which is electrically connected to a gate of the field effect transistor, and is short-circuited at a difference frequency between the carrier frequencies. For instance, the first difference frequency circuit is comprised of an inductor which is electrically connected to a drain of the field effect transistor, and a capacitor which is electrically connected at one end to the inductor, and is grounded at the other end, and the second difference frequency circuit is comprised of an inductor which is electrically connected to a gate of the field effect transistor, and a capacitor which is electrically connected at one end to the inductor, and is grounded at the other end.

13 Claims, 8 Drawing Sheets

MICRO-WAVE POWER AMPLIFIER

BACKGROUND OF THE INVENTION

1. Field of the Invention

The invention relates to a micro-wave power amplifier, and more particularly to a micro-wave power amplifier which amplifies a micro-wave signal including a plurality of carrier frequencies.

2. Description of the Related Art

As an employing device constituting a micro-wave power amplifier used in a satellite or a base station in a mobile communication system, a GaAs field effect transistor is often used.

Such a micro-wave power amplifier is required to have high power and high efficiency performances in order to accomplish reduction in size and low power consumption. In addition, a micro-wave power amplifier is further required to have a function of concurrently amplifying a plurality of signals, since data to be transmitted or received increases. To this end, a micro-wave power amplifier is required to have low mutual modulation distortion and be superior in linearity, in order to avoid exerting harmful influences on other channels.

If a micro-wave power amplifier concurrently receives a plurality of signals, the micro-wave power amplifier would have secondary distortion power at a frequency equal to a difference frequency between the received signals as well as mutual modulation distortion, due to non-linearity of the micro-wave power amplifier.

A micro-wave power amplifier is generally designed to include either a plurality of field effect transistors arranged in parallel with one another in a multi-finger pattern, or a plurality of field effect transistor chips arranged in parallel with one another, to thereby widen a gate width for accomplishing high power output.

In such a high-powered micro-wave power amplifier, if a low-frequency impedance is increased to some degrees, secondary distortion power which is generated at a frequency equal to a difference frequency between the received signals would be increased, and would be mixed with an output signal at a drain of the field effect transistor, resulting in that the mutual modulation distortion would become worse than the distortion characteristic of the micro-wave power amplifier. Consequently, the linearity of the field effect transistor could not be effectively utilized.

A field effect transistor accomplishing high power output is generally designed to be of an internal matching type transistor where a plurality of field effect transistors operating in parallel with one another are matched with one another, from the standpoint of heat radiation and general use. When such a high-powered field effect transistor receives a micro-wave signal including a plurality of carrier frequencies, secondary distortion caused by a difference frequency among carrier frequencies would deteriorate the mutual modulation distortion.

In order to solve such a problem as mentioned above, Japanese Patent No. 3060981 (Japanese Unexamined Patent Publication No. 10-233638) has suggested a micro-wave power amplifier which can prevent deterioration in distortion characteristics, even if a micro-wave signal to be amplified includes a plurality of carrier frequencies.

Figure 1:
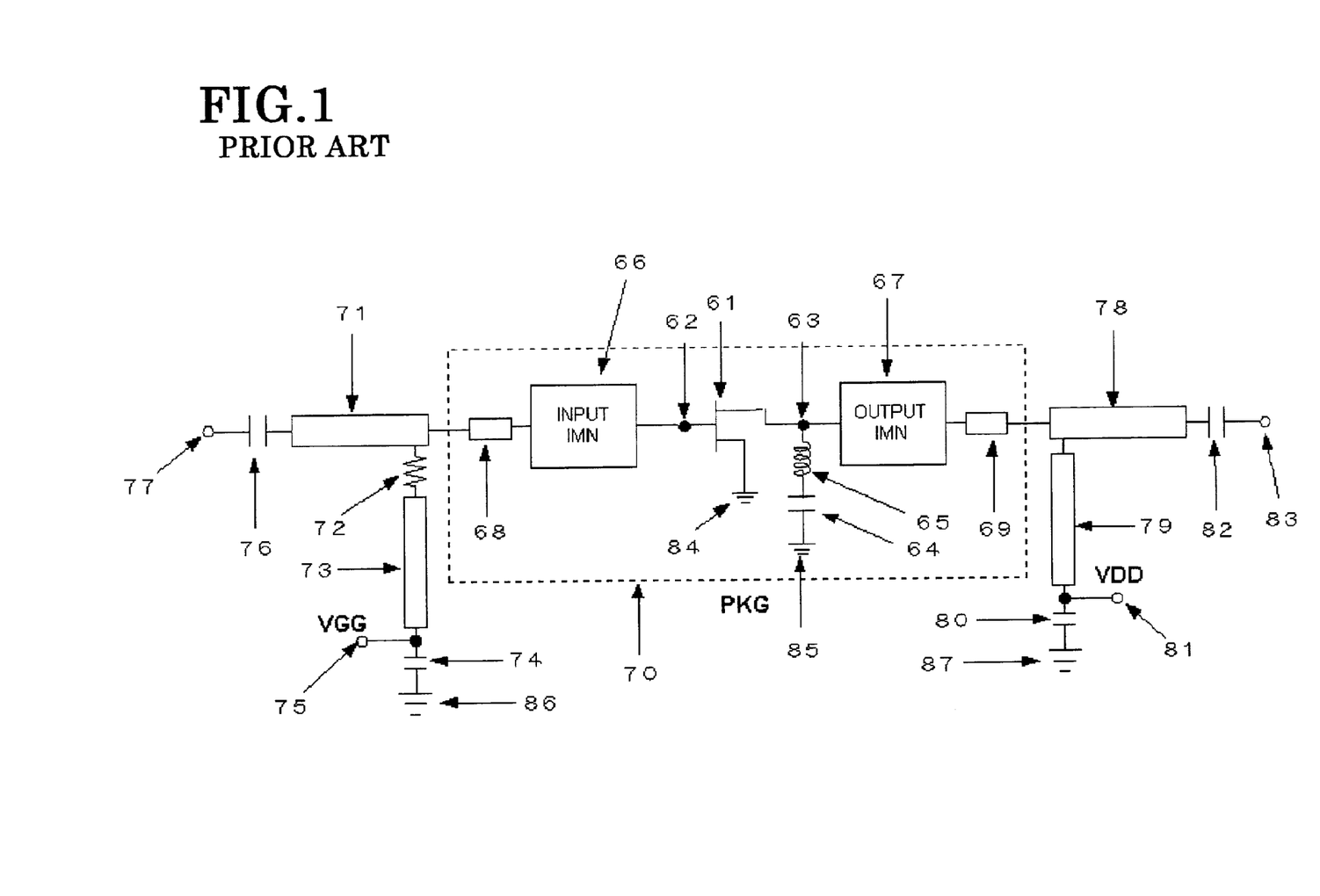
FIG. 1 is a circuit diagram of the conventional micro-wave power amplifier.
Figure 2:
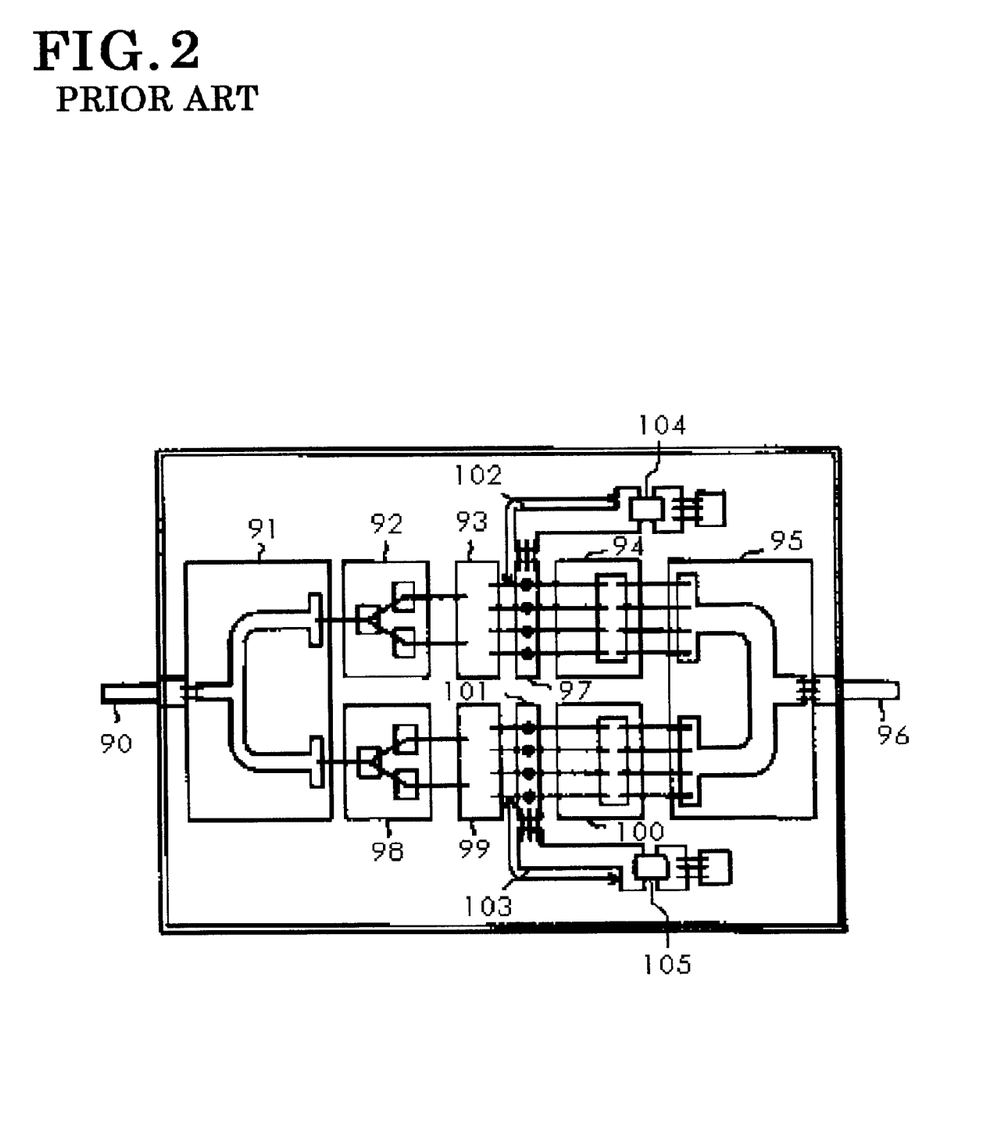
FIG. 2 is a block diagram of an example of a micro-wave power amplifier having such a structure as illustrated in FIG. 1.

FIG. 1 is a circuit diagram of the micro-wave power amplifier suggested in the above-identified Publication, and FIG. 2 is a block diagram of an example of the micro-wave power amplifier illustrated in FIG. 1.

With reference to FIG. 1, the micro-wave power amplifier is comprised of a signal input terminal 77 through which a signal is input into the micro-wave power amplifier, an input signal transmission path 71 through which a signal input through the signal input terminal 77 is transmitted to a package 70, a first capacitor 76 which is electrically connected between the signal input terminal 77 and the input signal transmission path 71 and removes dc current from the input signal, a gate bias applying terminal 75 through which a bias voltage is applied to a gate of a field effect transistor 61 arranged in the package 70, a first quarter wavelength path 73 electrically connected to the gate bias applying terminal 75, and transmitting a gate bias voltage applied through the gate bias applying terminal 75, to the field effect transistor 61, a gate protection resistor 72 electrically connected between the first quarter wavelength path 73 and the input signal transmission path 71, a first RF terminating capacitor 74 electrically connected at one end to the first quarter wavelength path 73 and grounded (86) at the other end, a signal output terminal 83 through which the package 70 transmits an output signal, an output signal transmission path 78 through which the package 70 transmits an output signal to the signal output terminal 83, a second capacitor 82 which is electrically connected between the output signal transmission path 78 and the signal output terminal 83 and removes dc current from the output signal, a drain bias applying terminal 81 through which a bias voltage is applied to a drain of the field effect transistor 61, a second quarter wavelength path 79 electrically connected to the drain bias applying terminal 81, and transmitting a drain bias voltage applied through the drain bias applying terminal 81, to the field effect transistor 61, and a second RF terminating capacitor 80 electrically connected at one end to the second quarter wavelength path 79 and grounded (87) at the other end.

The package 70 is comprised of the above-mentioned field effect transistor 61 having a grounded source, a gate electrode terminal 62 to which a gate of the field effect transistor 61 is electrically connected, a drain electrode terminal 63 to which a drain of the field effect transistor 61 is electrically connected, an input terminal lead 68 electrically connected between the input signal transmission path 71 and the gate electrode terminal 62, an input mating circuit 66 electrically connected between the input terminal lead 68 and the gate electrode terminal 62, an output terminal lead 69 electrically connected between the drain electrode terminal 63 and the output signal transmission path 78, an output matching circuit 67 electrically connected between the drain electrode terminal 65 and the output terminal lead 69, an difference frequency short-circuit inductor 65 electrically connected to the drain electrode terminal 63, and a difference frequency short-circuit capacitor 64 electrically connected at one end to the difference frequency short-circuit inductor 65, and grounded (85) at the other end.

The difference frequency short-circuit inductor 65 and the difference frequency short-circuit capacitor 64 define a difference frequency short-circuit circuit which is short-circuited at a difference frequency between carrier frequencies included in a micro-wave signal.

The input matching circuit 66, the first quarter wavelength path 73, the gate protection resistor 72 and the first RF terminating capacitor 74 define a gate bias circuit.

The output matching circuit 67, the second quarter wavelength path 79 and the second RF terminating capacitor 80 define a drain bias circuit.

FIG. 2 illustrates an example of a micro-wave power amplifier having such a circuit structure as illustrated in FIG.

1. The illustrated micro-wave power amplifier is of an internal matching type transistor where a plurality of field effect transistors operating in parallel with one another are matched with one another.

The micro-wave power amplifier is comprised of an input terminal 90 through which a micro-wave signal is received, a distribution circuit 91 which distributes the received micro-wave signal, matching circuit 92 ad 98 which match the received micro-wave signals with respect to an impedance by virtue of inductance and capacitance, field effect transistor chips 93 and 99 which amplify the distributed micro-wave signals, bonding patterns 97 and 101 arranged in the vicinity of drain electrodes of the field effect transistor chips 93 and 99, respectively, difference frequency short-circuit LC circuits each of which is comprised of a micro-strip path 102, 103 and a capacitor 104, 105, respectively, matching circuits 94 and 100 each of which matches a micro-wave signal having been amplified by the field effect transistor chips 93 and 99, with respect to an impedance by virtue of an inductance and/or a capacitance, a synthesizer circuit 95 which synthesizes the micro-wave signals with one another which signals have been matched by the matching circuits 94 and 100, and an output terminal 96 through which the micro-wave signals having been synthesized with one another are output.

Each of the micro-strip paths 102 and 103 is electrically connected to one end of the bonding pattern 97 and 101, respectively, and short-circuits distortion caused by a difference frequency between the carrier frequencies. Further, each of the micro-strip paths 102 and 103 has a length shorter than a quarter wavelength of the micro-wave signal.

When the micro-wave power amplifier having the above-mentioned structure receives a micro-wave signal having a plurality of carrier frequencies, there is generated distortion due to a difference frequency between the carrier frequencies. For instance, assuming that a micro-wave signal includes carrier frequencies f1 and f2, the distortion would have a frequency defined as an absolute value of a difference between the carrier frequencies f1 and f2, expressed as |f1−f2|. The difference frequency |f1−f2| increases secondary distortion, which results in an increase in mutual modulation distortion.

Hence, the micro-wave power amplifier illustrated in FIG. 2 was designed to decrease an impedance by resonating the difference frequency short-circuit LC circuits each comprised of the micro-strip path 102, 103 and the capacitor 104, 105, to thereby absorb the difference frequency distortion into a ground to smooth the difference frequency distortion for reducing the distortion caused by the difference frequency between the carrier frequencies.

However, the conventional micro-wave power amplifiers illustrated in FIGS. 1 and 2 are accompanied with problems as follows, if higher power is output from them.

In order to accomplish high power performance in the conventional micro-Wave power amplifier, the field effect transistor 61 is generally designed to have an increased gate width, as mentioned earlier. An increase in a gate width would cause an increase in output power transmitted from the field effect transistor 61, which further causes an increase in distortion caused by a difference frequency between carrier frequencies.

It was found out that the mutual modulation distortion was degraded as a difference between the input carrier frequencies became greater in the conventional micro-wave power amplifier, even if the difference frequency short-circuit circuit comprised of the difference frequency short-circuit capacitor 64 and the difference frequency short-circuit inductor 65 was electrically connected to the drain electrode terminal 63.

In order to make it possible to transmit data in a greater amount, a difference between carrier frequencies is required to be greater and a bandwidth is also required to be wider. However, the above-mentioned problems are bars to a greater difference in carrier frequencies.

Figure 3:
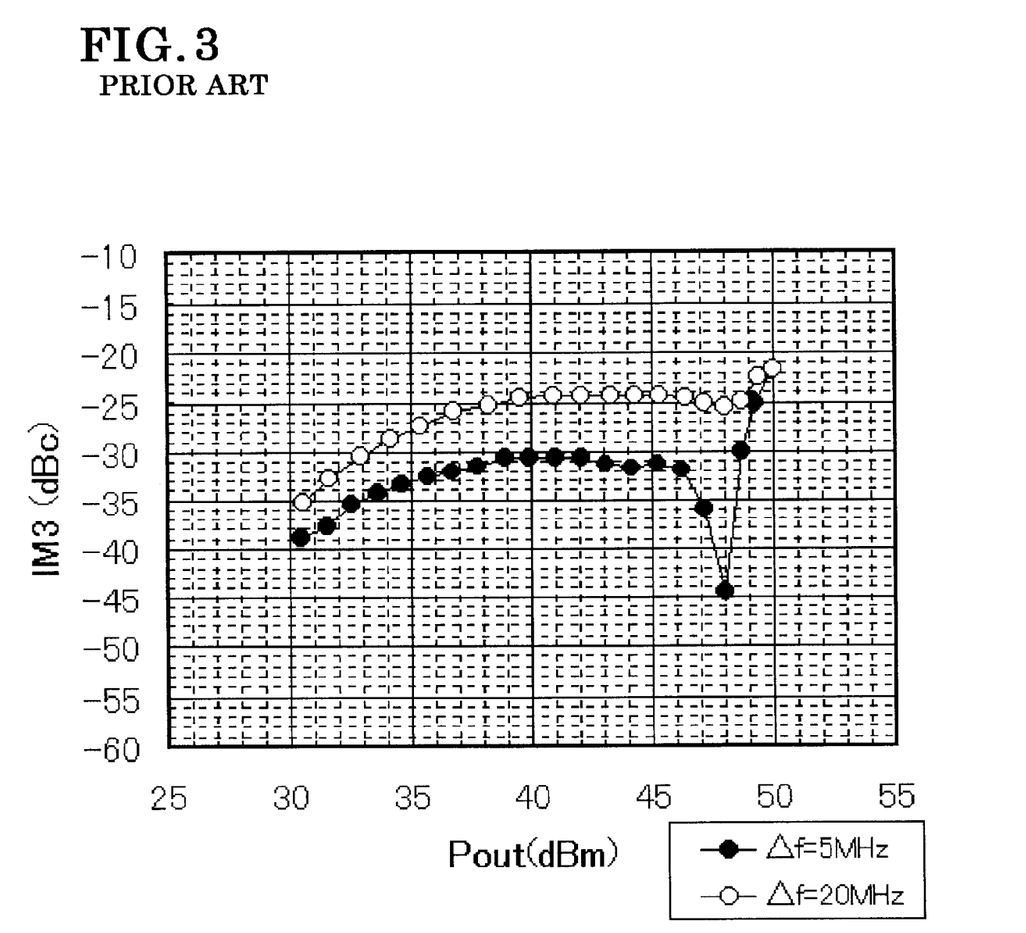
FIG. 3 is a graph showing the distortion characteristic of the conventional micro-wave power amplifier.

FIG. 3 is a graph showing the tertiary mutual modulation distortion IM3 generated when a two-wave signal having frequencies f1 and f2 is input into the conventional micro-wave power amplifier in which the difference frequency short-circuit circuit is electrically connected to the drain electrode terminal 63 of the field effect transistor chip 61 having A total gate width of 600 mm.

Herein, the tertiary mutual modulation distortion IM3 is defined as follows.

$$IM3=2f1-f2$$

In FIG. 3, solid circles (●) indicate tertiary mutual modulation distortion IM3 obtained when a two-wave signal having frequencies f1 of 2.1 GHz and f2 of 2.105 GHz is input into the micro-wave power amplifier, where a difference frequency is 5 MHz (0.005 GHz), and hollow circles (○) indicate tertiary mutual modulation distortion IM3 obtained when a two wave signal having frequencies f1 of 2.1 GHz and f2 of 2.120 GHz is input into the micro-wave power amplifier, where a difference frequency is 20 MHz (0.02 GHz).

As is obvious in view of FIG. 3, IM3 (○) obtained when the two-wave signal having a difference frequency of 20 MHz is input into the micro-wave power amplifier is degraded by about 5 dB in comparison with IM3 (●) obtained when the two-wave signal having a difference frequency of 5 MHz is input into the micro-wave power amplifier.

As is understood in view of the explanation having been made above, in spite that a low frequency impedance is sufficiently reduced by electrically connecting the difference frequency short-circuit circuit to the drain electrode terminal 63 of the field effect transistor 61, the mutual modulation distortion is degraded as a difference between the input carrier frequencies becomes greater.

This is considered because regardless that a difference frequency corresponding to a difference between carrier frequencies caused by the non-linearity in the output side of the field effect transistor 61 is short-circuited by the difference frequency short-circuit circuit electrically connected to the drain electrode terminal 63, a difference frequency between carrier frequencies, caused by the non-linearity in the input side of the field effect transistor 61 which non-linearity is not ignorable due to an increase in a gate width, deteriorates the mutual modulation distortion.

Japanese Patent No. 2998837 (Japanese Unexamined Patent Publication No. 11-31923) has suggested a micro-wave frequency amplifier including a field effect transistor having a source grounded and carrying out non-linear operation in a micro-wave band, an input impedance matching circuit, and an output impedance matching circuit. The input impedance matching circuit is comprised of a fundamental wave input impedance matching circuit and a doubled-wave impedance control circuit which is electrically connected to a gate of the field effect transistor and which defines a resonance circuit which resonates at a frequency equal to a doubled frequency of a fundamental wave frequency. The output impedance matching circuit is comprised of a short-circuit device which is electrically connected to a drain of the field effect transistor and which short-circuits at the fundamental frequency, and a matching circuit which carries out impedance-matching to a doubled-wave of the fundamental wave.

However, the above-mentioned problems remain unsolved even in the above-identified Patent.

SUMMARY OF THE INVENTION

In view of the above-mentioned problems in the conventional micro-wave power amplifier, it is an object of the present invention to provide a micro-wave power amplifier in which distortion characteristic is not degraded, even though a difference between input carrier frequencies becomes greater.

There is provided a micro-wave power amplifier which amplifies a micro-wave signal including a plurality of carrier frequencies different from one another, including (a) a field effect transistor having a grounded source, (b) a first difference frequency circuit which is electrically connected to a drain of the field effect transistor, and is short-circuited at a difference frequency between the carrier frequencies, and (c) a second difference frequency circuit which is electrically connected to a gate of the field effect transistor, and is short-circuited at a difference frequency between the carrier frequencies.

For instance, the first difference frequency circuit may be comprised of (b1) an inductor which is electrically connected to a drain of the field effect transistor, and (b2) a capacitor which is electrically connected at one end to the inductor, and is grounded at the other end.

For instance, the second difference frequency circuit is comprised of (c1) an inductor which is electrically connected to a gate of the field effect transistor, and (c2) a capacitor which is electrically connected at one end to the inductor, and is grounded at the other end.

It is preferable that the first difference frequency circuit is comprised of a plurality of third difference frequency circuits, wherein each of the third difference frequency circuits is comprised of an inductor which is electrically connected to a drain of the field effect transistor, and a capacitor which is electrically connected at one end to the inductor, and is grounded at the other end, an inductance of the inductor and a capacity of the capacitor being determined such that the third difference frequency circuits are resonated with one another at the difference frequency.

It is preferable that the second difference frequency circuit is comprised of a plurality of third difference frequency circuits, wherein each of the third difference frequency circuits being comprised of an inductor which is electrically connected to a gate of the field effect transistor, and a capacitor which is electrically connected at one end to the inductor, and is grounded at the other end, an inductance of the inductor and a capacity of the capacitor being determined such that the third difference frequency circuits and resonated with one another at the difference frequency.

For instance, the inductor may be comprised of a bonding wire, and the capacitor may be comprised of a multi-layered ceramic capacitor.

The advantages obtained by the aforementioned present invention will be described hereinbelow.

In the above-mentioned conventional micro-wave power amplifier; if a field effect transistor is designed to have an increased gate width in order to accomplish high power output, difference frequency distortion, caused by a difference frequency between carrier signals which difference frequency is caused by the non-linearity in the input side of the field effect transistor, increases.

In contrast, in the micro-wave power amplifier in accordance with the present invention, the first difference frequency circuit comprise of an inductance and a capacitor is electrically connected to a drain of a field effect transistor, and further the second difference frequency circuit comprised of an inductance and a capacitor is electrically connected to a gate of the field effect transistor. As a result, a difference frequency between carrier frequencies, generated not only at the output side of the field effect transistor but also at the input side of the field effect transistor can be terminated by short-circuiting, ensuring removal of influence exerted on the mutual modulation distortion.

In addition, since the first and second difference frequency circuits are electrically connected to a gate and a drain of the field effect transistor, respectively, if a fundamental wave frequency band and a difference frequency band of a carrier frequency are sufficiently far away from each other, the difference frequency band can be terminated by short-circuiting without any influence to the fundamental wave frequency band. Hence, the micro-wave power amplifier in accordance with the present invention makes it possible to prevent degradation in the distortion characteristic, even if a difference between input carrier frequencies becomes greater.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

First Embodiment

Figure 4:
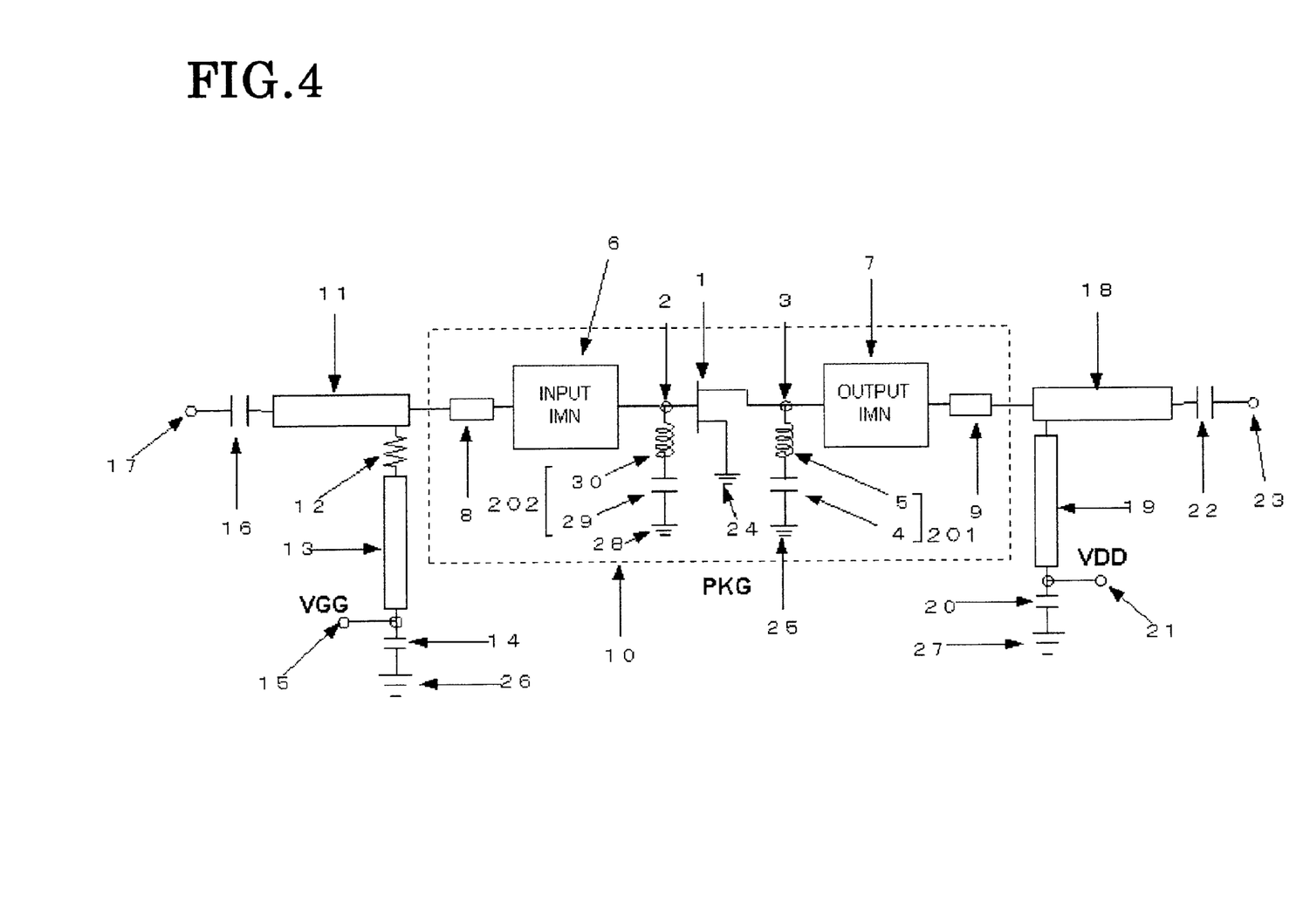
FIG. 4 is a circuit diagram of a micro-wave power amplifier in accordance with the first embodiment of the present invention.

FIG. 4 is a circuit diagram of a micro-wave power amplifier in accordance with the first embodiment, and FIG.

Figure 5:
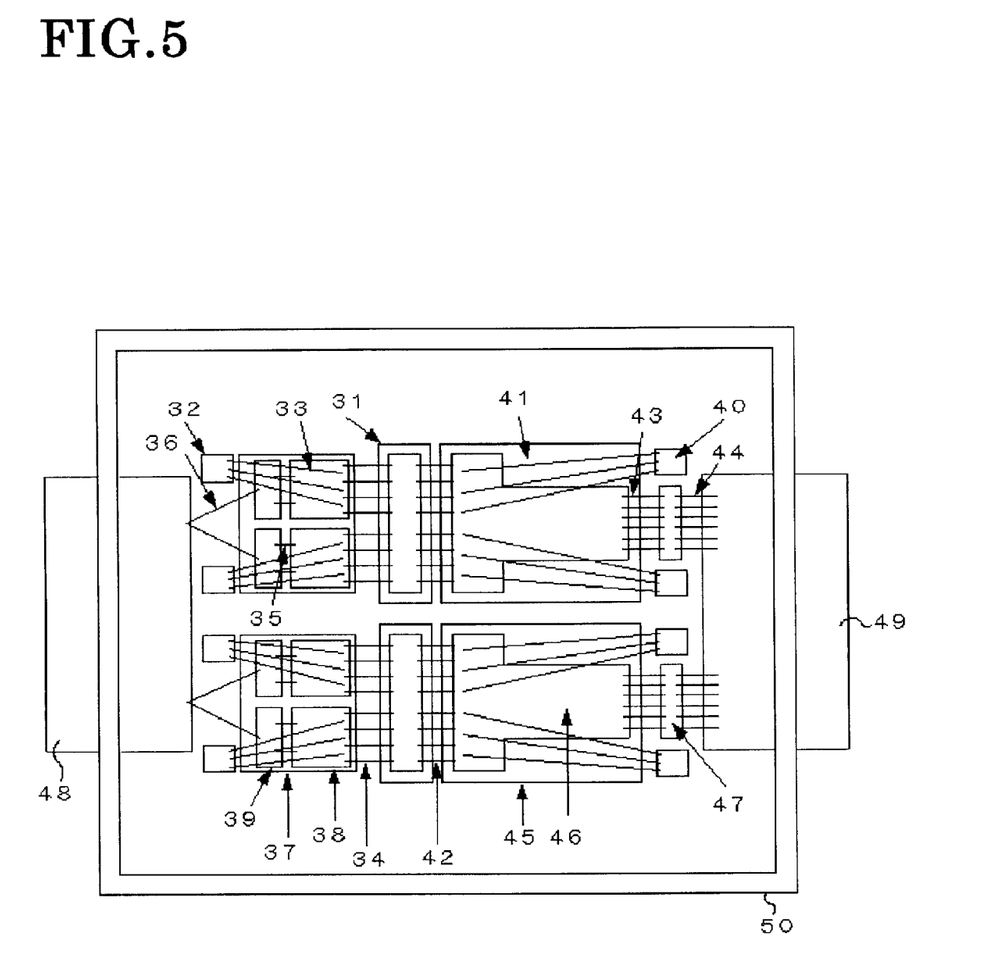
FIG. 5 is a block diagram of an example of a micro-wave power amplifier having such a structure as illustrated in FIG. 4.

5 is a block diagram of an example of a micro-wave power amplifier having such a structure as illustrated in FIG 4.

With reference to FIG. 4, the micro-wave power amplifier is comprised of a signal input terminal 17 through which a micro-wave signal is input into the micro-wave power amplifier, an input signal transmission path 11 through which the micro-wave signal input through the signal input terminal 17 is transmitted to a package 10, a first capacitor 16 which is electrically connected between the signal input terminal 17 and the input signal transmission path 11 and removes dc current from the input signal, a gate bias applying terminal 16 through which a bias voltage is applied to a gate of a field effect transistor 1 arranged in the package 10, a first quarter wavelength path 13 electrically connected to the gate bias applying terminal 15, and transmitting a gate bias voltage applied through the gate bias applying terminal 15, to the field effect transistor 1, a gate protection resistor 12 electrically connected between the first quarter wavelength path 13 and the input signal transmission path 11, a first RF terminating capacitor 14 electrically connected at one end to the first quarter wavelength path 13 and grounded (26) at the other end, a signal output terminal 23 through which the package 10 transmits its output signal, an output signal transmission path 18 through which the package 10 transmit its output signal to the signal output terminal 23, a second capacitor 22 which is electricity connected between the output signal transmission path 18 and the signal output terminal 23 and removes dc current from the output signal, a drain bias applying terminal 21 through which a bias voltage is applied to a drain of the field effect transistor 1, a second quarter wavelength path 19 electrically connected to the drain bias applying terminal 21, and transmitting a drain bias voltage applied through the drain bias applying terminal 21, to the field effect transistor 1, and a second RF terminating capacitor 20 electrically connected at one end to the second quarter wavelength path 19 and grounded (27) at the other end.

The package 10 is comprised of the above-mentioned field effect transistor 1 having a grounded source, a gate electrode terminal 2 to which a gate of the field effect transistor 1 is electrically connected, a drain electro terminal 3 to which a drain of the field effect transistor 1 is electrically connected, an input terminal lead 8 electrically connected between the input signal transmission path 11 and the gate electrode terminal 2, an input matching circuit 6 electrically connected between the input terminal lead 8 and the gate electrode terminal 2, an output terminal lead 9 electrically connected between the drain electrode terminal 3 and the output signal transmission path 18, an output matching circuit 7 electrically connected between the drain electrode terminal 3 and the output terminal lead 9, a first difference frequency short-circuiting circuit 201 electrically connected to the drain electrode terminal 3, and a second difference frequency short-circuiting circuit 202 electrically connected to the gate electrode terminal 2.

The first difference frequency short-circuiting circuit 201 is comprised of a bonding wire 5 electrically connected to the drain electrode terminal 3 of the field effect transistor 1, acting as an output-side difference frequency short-circuiting inductor, and an output-side difference frequency short-circuiting capacitor 4 electrically connected at one end to the bonding wire 5, and grounded (25) at the other end.

The second difference frequency short-circuiting circuit 202 is comprised of a bonding wire 30 electrically connected to the gate electrode terminal 2 of the field effect transistor 1, acting as an input-side difference frequency short-circuiting inductor, and an input-side difference frequency short-circuiting capacitor 29 electrically connected at one end to the bonding wire 30, and grounded (28) at the other end.

The first and second difference frequency short-circuiting circuits 201 and 202 are designed to short-circuit at a difference frequency between carrier frequencies included the micro-wave signal input into the package 10 through the signal input terminal 17.

The input matching circuit 6, the first quarter wavelength path 13, the gate protection resistor 12 and the first RF terminating capacitor 14 define a gate bias circuit.

The output matching circuit 7, the second quarter wavelength path 19 and the second RF terminating capacitor 20 define a drain bias circuit.

In the micro-wave power amplifier in accordance with the first embodiment, since the first and second difference frequency short-circuiting circuits 201 and 202 each comprised of the bonding wire 5, 30 and the capacitor 4, 29 are electrically connected to the field effect transistor 1 in the vicinity of a drain electrode and a gate electrode, respectively, the bonding wires 5 and 30 can be shortened, ensuring that it is possible to suppress an increase in a low frequency impedance, caused by an inductance (L) of the bonding wires 5 and 30, without any loss in a fundamental wave frequency.

In addition, the shortened bonding wires 5 and 30 provide the secondary advantage that even if a difference frequency between carrier frequencies in a micro-wave input signal is great, it would be possible to prevent degradation in distortion characteristic of the micro-wave power amplifier, caused by a low frequency impedance, since the low frequency impedance is terminated at a low value in a wide band.

The reasons are as follows.

An absolute value of an impedance Z1 of the first and second difference frequency short-circuiting circuits 201 and 202 is expressed as follows, if a resistance R in the first and second difference frequency short-circuiting circuits 201 and 202 is ignored, because it is quite small.

$$|Z1|=\omega L+1/\omega C$$

If a difference frequency is short-circuited through the use of a capacitor having a sufficiently great capacity, the term $(1/\omega C)$ can be ignored, and accordingly, inductance $\omega L$ caused by the bonding wires 5 and 30 is dominant in a low frequency impedance from a drain or a gate of the filed effect transistor 1 to a load. As mentioned above, since the bonding wires 5 and 30 can be shortened, the inductance $\omega L$ can be reduced. As a result, an absolute value of the impedance Z1 of the first and second difference frequency short-circuiting circuits 201 and 202 can be reduced, ensuring that it is possible to prevent degradation in the distortion characteristic of the micro-wave power amplifier.

By electrically connecting the first and second difference frequency short-circuiting circuits 201 and 202 to the drain electrode terminal 3 and the gate electrode terminal 2 of the field effect transistor 1 having an increased gate width, respectively, an impedance of a fundamental wave at the drain electrode terminal 3 and the gate electrode terminal 2 of the field effect transistor 1 becomes quite small. Specifically the impedance at the drain electrode terminal 3 is 0.5 Ω, and the impedance at the gate electrode terminal 2 is 0.1 Ω. Accordingly even if the inductance L in the first and second difference frequency short-circuiting circuits 201 and 202 is reduced, and the impedance of a frequency of a fundamental wave in the first and second difference frequency short-circuiting circuits 201 and 202 is also reduced, the fundamental wave frequency is never harmfully influenced, and there is no loss in the fundamental wave frequency, because the difference frequency which is equal to or smaller than 20 MHz is about hundred times smaller than the frequency of the fundamental wave which is equal to or greater than 2 GHz.

For instance, assuming that input signals have a main frequency of 2 GHz, and a maximum difference in frequency among the input signals is 20 MHz, the bonding wires 6 and 30 may be designed to have an inductance L of 0.5 nH, and the capacitors 4 and 29 may be designed to have a capacitance of 1 $\mu$F.

FIG. 5 illustrates an example of a micro-wave power amplifier having the structure as illustrated in FIG. 4. The illustrated micro-wave power amplifier is of an internal matching type transistor where a plurality of field effect transistors operating in parallel with one another are matched with one another.

The illustrated micro-wave power amplifier is comprised of a package 50 including a plurality of the field effect transistor chips 1 for amplifying a micro-wave signal input thereinto, an input terminal lead 48 through which a micro-wave input signal is input into the package 50, and an output terminal lead 49 through which the package 50 transmits its output signal.

The package 50 is comprised of two field effect transistors 31, two substrates 37 each having a high dielectric constant, four input matching capacitors 38 and 39 arranged on each of the substrates 37 two by two, four capacitors 32 used for an input-side difference frequency short-circuiting circuit, first bonding wires 33 electrically connecting the input matching capacitors 38 to the capacitors 32, second bonding wires 34 electrically connecting the field effect transistor chips 31 to the input matching capacitors 38, third bonding wires 35 electrically connecting the input matching capacitors 38 and 39 to each other, fourth bonding wires 36 electrically connecting the input terminal lead 48 to the input matching capacitors 39, two substrates 45 composed of dielectric material, impedance lines 46 each formed on each of the substrates 45, and matching a micro-wave signal having been amplified by the field effect transistor chip 1, to a load impedance, two output matching capacitors 47 each associated with each of the impedance lines 46, fifth bonding wires 42 electrically connecting each of the field effect transistors 31 to each of the impedance lines 46, sixth bonding wires 43 electrically connecting each of the impedance lines 46 to each of the output matching capacitors 47, seventh bonding wires 44 electrically connecting each of the output matching capacitors 47 to the output terminal lead 49, four capacitors 40 used for an output-side difference frequency short-circuiting circuit, and eighth bonding wires 41 electrically connecting each of the impedance lines 46 to each of the capacitors 40.

Inductance in the bonding wires 34 to 36 and the input matching capacitors 38 and 39 formed on the substrates 37 define a matching circuit which matches an input impedance of the field effect transistors 31 and a fundamental wave to each other.

The capacitors 32 are electrically connected to the field effect transistor 31 in the vicinity of a gate electrode through the first bonding wires 33, and the capacitors 32 and the first bonding wires 33 define a difference frequency short-circuiting LC circuit having an inductance and a capacitance both of which short-circuit in dependence on a difference frequency between carrier frequencies.

In the first embodiment, each of the capacitors 32 is comprised of a multi-layered ceramic capacitor having a size of about 0.3 mm×0.3 mm. The multi-layered ceramic capacitors 32 are located in the package 50 in an area in which the input matching capacitors 38 and 39 are not formed. The multi-layered ceramic capacitor 32 includes a lower electrode grounded through the package 50 composed of an electrical conductor, and an upper electrode electrically connected to an input matching circuit through the first bonding wires 33.

The capacitors 40 are electrically connected to the field effect transistor 31 in the vicinity of a drain electrode through the eighth bonding wires 41, and the capacitors 40 and the eighth bonding wires 41 define a difference frequency short-circuiting LC circuit having an inductance and a capacitance both of which short-circuit in dependence on a difference frequency between carrier frequencies.

In the first embodiment, each of the capacitors 40 is comprised of a multi-layered ceramic capacitor. The multi-layered ceramic capacitors 40 are located in the package 50 in an area in which the output matching capacitors 47 are not formed. The multi-layered ceramic capacitor 40 includes a lower electrode grounded through the package 50 composed of an electrical conductor, and an upper electrode electrically connected to an output matching circuit through the eighth bonding wires 41.

Figure 6:
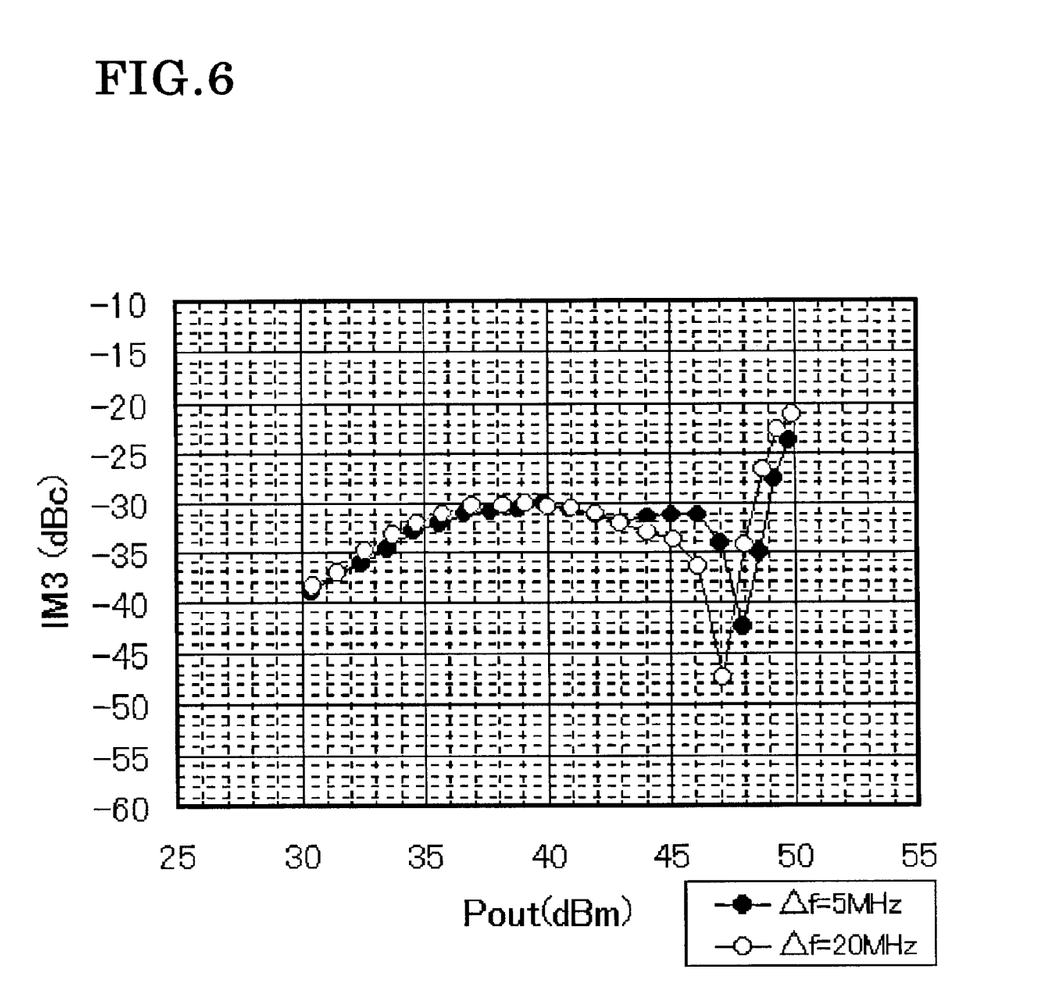
FIG. 6 is a graph showing the distortion characteristic of the micro-wave power amplifier in accordance with the first embodiment of the present invention.

FIG. 6 is a graph showing the tertiary mutual modulation distortion IM3 generated when a two-wave signal having frequencies f1 and f2 is input into the micro-wave power amplifier in accordance with the first embodiment. The field effect transistor chip has a total gate width of 600 mm.

As mentioned earlier, the tertiary mutual modulation distortion IM3 is defined as follows.

$$IM3=2f1-f2$$

In FIG. 6, solid circles (●) indicate tertiary mutual modulation distortion IM3 obtained when a two-wave signal having frequencies f1 of 2.1 GHz and f2 of 2.105 GHz is input into the micro-wave power amplifier, where a difference frequency is 5 MHz (0.005 GHz), and hollow circles (○) indicate tertiary mutual modulation distortion IM3 obtained when a two-wave signal having frequencies f1 of 2.1 GHz and f2 of 2.120 MHz is input into the micro-wave power amplifier, where a difference frequency is 20 MHz (0.02 GHz).

As is obvious in view of FIG. 6, IM3 (○) obtained when the two-wave signal having a difference frequency of 20 MHz is input into the micro-wave power amplifier is almost equal to IM3 (●) obtained when the two-wave signal having a difference frequency of 5 MHz is input into the micro-wave power amplifier.

As having been explained so far, the micro-wave power amplifier in accordance with the first embodiment in which the first and second difference frequency short-circuiting circuits 201 and 202 are electrically connected to the drain and gate electrode terminals 3 and 2, respectively, makes it possible to prevent degradation in the mutual modulation distortion, even if a difference among the input carrier frequencies is great.

This is because the second difference frequency short-circuiting circuit 202 comprised of the bonding wire 30 and the capacitor 29 is electrically connected to the gate electrode terminal 2 in addition to that the first difference frequency short-circuiting circuit 202 comprised of the bonding wire 5 and the capacitor 4 is electrically connected to the drain electrode terminal 3, and hence, a difference frequency between carrier frequencies is terminated not only at the output-side of the field effect transistor 1, but also at the input-side of the field effect transistor 1, ensuring that the mutual modulation distortion is not harmfully influenced.

In the conventional micro-wave power amplifier, a low frequency impedance at the input-side of the field effect transistor was designed to be high by means of the gate protection resistor 12 arranged in the gate bias circuit, in order to ensure stabilization of the micro-wave power amplifier. This is because the difference frequency distortion generated at the input-aide of the field effect transistor 1 is smaller than the same generated at the output-side of the field effect transistor 1, and accordingly, is ignorable. Thus, the influence exerted by the difference frequency distortion generated at the input-side of the field effect transistor 1 was not analyzed at all.

However, since a gate width was increased for accomplishing high power output, the difference frequency distortion caused by the non-linearity in the input-side of the field effect transistor 1 was no longer be able to be ignored.

In contrast, in the micro-wave power amplifier in accordance with the first embodiment, the first difference frequency short-circuiting circuit 201 comprised of the bonding wire 5 and the capacitor 4 is electrically connected to the drain electrode terminal 3 of the field effect transistor 1, and further the second difference frequency short-circuiting circuit 202 comprised of the bonding wire 30 and the capacitor 29 is electrically connected to the gate electrode terminal 2 of the field effect transistor 1. As a result, the difference frequency between carrier frequencies, generated not only at the output side of the field effect transistor 1 but also at the input side of the field effect transistor 1 can be terminated by short-circuiting, ensuring removal of harmful influence exerted on the mutual modulation distortion.

In addition, since the first and second difference frequency short-circuiting circuits 201 and 202 are electrically connected to the field effect transistor in the vicinity of the gate and the drain, respectively, if a fundamental wave frequency band and a difference frequency band of a carrier frequency are sufficiently far away from each other, the difference frequency band can be terminated by short-circuiting without any influence to the fundamental wave frequency band.

Hence, the micro-wave power amplifier in accordance with the first embodiment makes it possible to prevent degradation in the distortion characteristic, even if a difference between the input carrier frequencies becomes greater.

Second Embodiment

Figure 7:
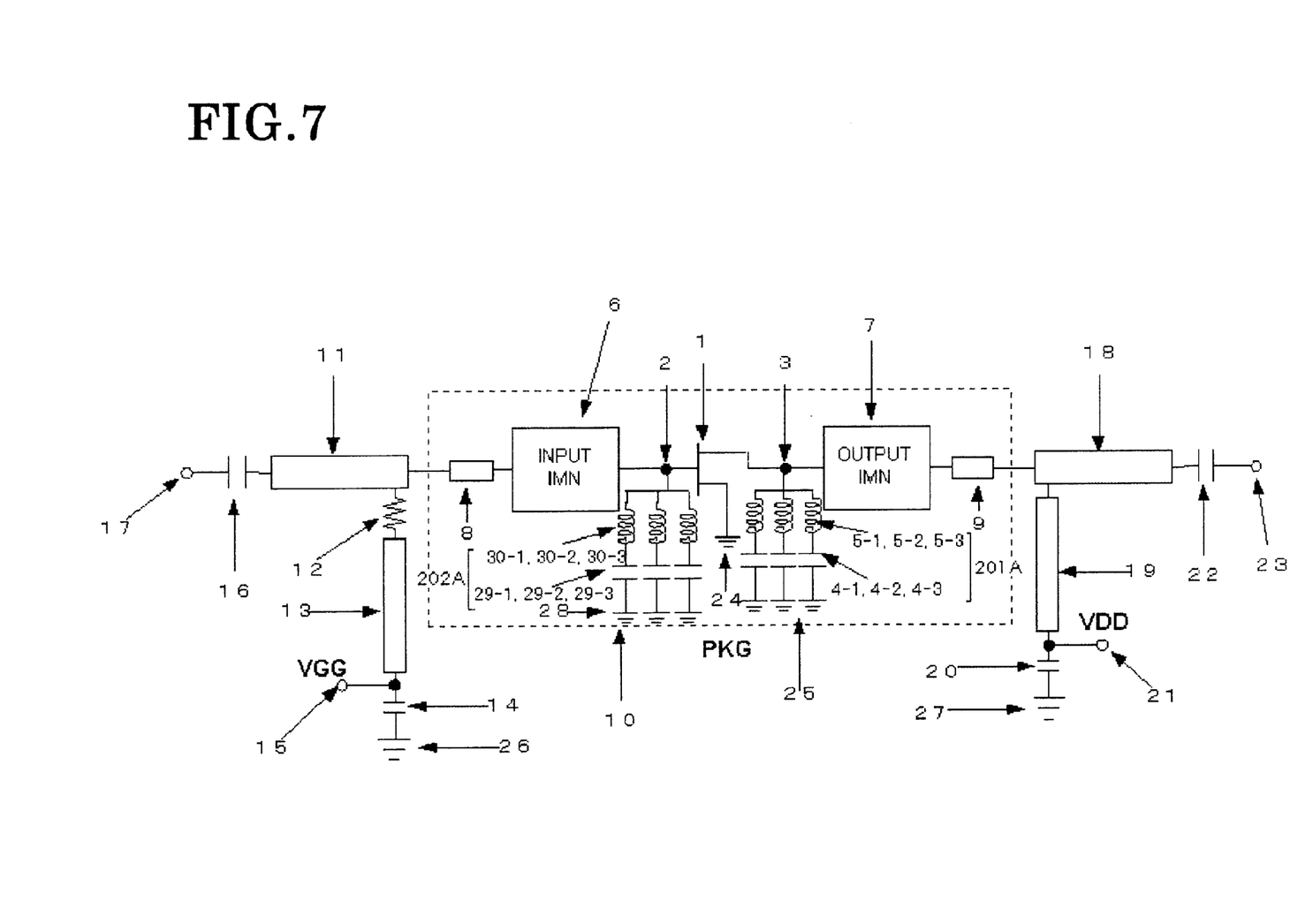
FIG. 7 is a circuit diagram of a micro-wave power amplifier in accordance with the second embodiment of the present invention.
Figure 8:
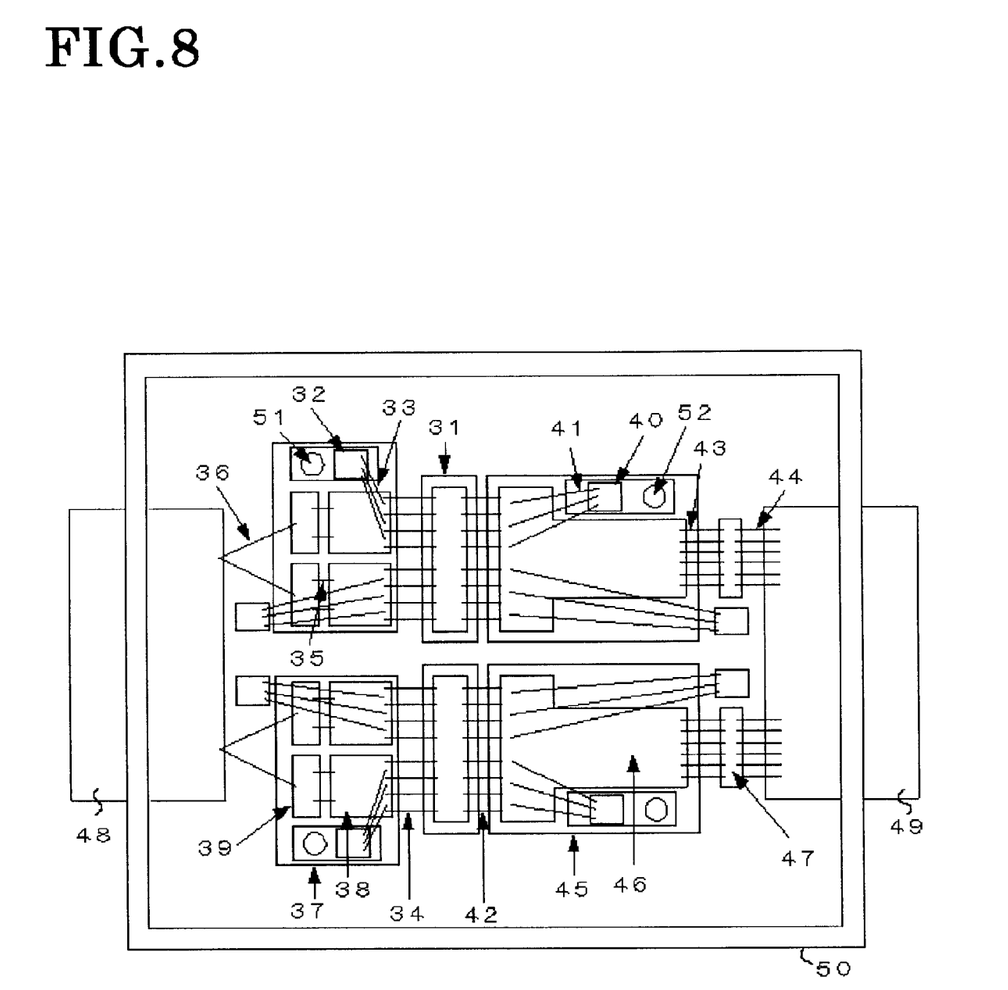
FIG. 8 is a block diagram of an example of a micro-wave power amplifier having such a structure as illustrated in FIG. 7.

FIG. 7 is a circuit diagram of a micro-wave power amplifier in accordance with the second embodiment, and FIG. 8 is a block diagram of an example of a micro-wave power amplifier having such a structure as illustrated in FIG. 7.

The first and second difference frequency short-circuiting circuits 201A and 202A in the second embodiment are designed to have different structures from the structures of the first and second difference frequency short-circuiting circuits 201 and 202 in the first embodiment. The micro-wave power amplifier in accordance with the second embodiment has the same structure as the structure of the micro-wave power amplifier except the above-mentioned structural difference in the first and second difference frequency short-circuiting circuits 201A, 202A and 201, 202.

The first difference frequency short-circuiting circuit 201A is comprised of three third difference frequency short-circuiting circuits or LC series resonance circuits each of which is comprised of an inductor 5-1, 5-2 or 5-3 electrically connected to the drain electrode terminal 3, and a capacitor 4-1, 4-2 or 4-3 electrically connected at one end to the inductor 5-1, 5-2 or 5-3, and grounded (25) at the other end.

The LC series resonance circuits constituting the first difference frequency short-circuiting circuit 201A are electrically connected in parallel to one another.

The LC series resonance circuits have resonance frequencies different from one another, and an inductance of the inductor 5-1, 5-2 or 5-3 and a capacitance of the capacitor 4-1, 4-2 or 4-3 are determined such that the LC series resonance circuits resonate with one another at a difference frequency between carrier frequencies included in the micro-wave signals input into the package 10 through the signal input terminal 17.

The second difference frequency short-circuiting circuit 202A is comprised of three third difference frequency short-circuiting circuits or LC series resonance circuits each of which is comprised of an inductor 30-1, 30-2 or 30-3 electrically connected to the gate electrode terminal 2, and a capacitor 29-1, 29-2 or 29-3 electrically connected at one end to the inductor 30-1, 30-2 or 30-3, and grounded (28) at the other end.

The LC series resonance circuits constituting the second difference frequency short-circuiting circuit 202A are electrically connected in parallel to one another.

The LC series resonance circuits have resonance frequencies different from one another, and an inductance of the inductor 30-1, 30-2 or 30-3 and a capacitance of the capacitor 29-1, 29-2 or 29-3 are determined such that the LC series resonance circuits resonate with one another at a difference frequency between carrier frequencies included in the micro-wave signals input into the package 10 through the signal input terminal 17.

In the micro-wave power amplifier in accordance with the second embodiment, since the first and second difference frequency short-circuiting circuits 201A and 202A having resonance frequencies different from each other and each comprised of a plurality of LC series resonance circuits each including the bonding wires or inductances and the capacitors or capacitances are electrically connected to the drain electrode terminal 3 and the gate electrode terminal 2 of the field effect transistor 1, respectively, it would be possible to sufficiently lower low frequency impedances in both input- and output-sides of the field effect transistor 1 without exerting any harmful influence or loss on a fundamental wave frequency.

Accordingly, regardless of various differences between carrier frequencies of micro-wave input signals, since the low frequency impedance is terminated at a low value in a wide band it would be possible to suppress degradation in the distortion characteristic of the micro-wave power amplifier, caused by the low frequency impedance.

FIG. 8 illustrates an example of a micro-wave power amplifier having the structure as illustrated in FIG. 7.

The micro-wave power amplifier illustrated in FIG. 8 is structurally different from the micro-wave power amplifier illustrated in FIG. 5 with respect to the structures of the first and second difference frequency short-circuiting circuits 201A and 202A, and has the same structure as the structure of the micro-wave power amplifier illustrated in FIG. 5 except the first and second difference frequency short-circuiting circuits 201A and 202A.

In the example illustrated in FIG. 8, the first difference frequency short-circuiting circuit 201A is comprised of a plurality of LC series resonance circuits each of which is comprised of a plurality of capacitors 40 used for an output-side difference frequency short-circuiting circuit, and a plurality of bonding wires 41 each electrically connecting each of the capacitors 40 to each of impedance lines 46. The second difference frequency short-circuiting circuit 202A is comprised of a plurality of LC series resonance circuits each of which is comprised of a plurality of capacitors 32 used for an input-side difference frequency short-circuiting circuit, and a plurality of bonding wires 33 each electrically connecting each of the capacitors 32 to each of each of input matching capacitors 38.

The LC series resonance circuits have resonance conditions different from one another, and an inductance of the bonding wires 41 or 33 and a capacitance of the capacitor 40 or 32 are determined such that the LC series resonance circuits resonate with one another at a difference frequency between carrier frequencies included in the micro-wave signals input into the package 50 through the input terminal lead 48.

Each of the capacitors 32 is comprised of a multi-layered ceramic capacitor having a size of about 0.3 mm×0.3 mm. The multi-layered ceramic capacitors 32 are located in the package 50 in an area in which the input matching capacitors 38 and 39 are not formed. The multi-layered ceramic capacitor 32 includes a lower electrode grounded through the package 50 composed of an electrical conductor, and an upper electrode electrically connected to an input matching circuit through the bonding wires 33.

As an alternative, the substrates 37 may be formed with a through-hole 51 reaching a lower surface of the package 50, and the multi-layered ceramic capacitor 32 may be formed on the substrate 37 such that a lower electrode of the multi-layered ceramic capacitor 32 is located above the through-hole 51.

Each of the capacitors 40 is comprised of a multi-layered ceramic capacitor. The multi-layered ceramic capacitors 40 are located in the package 50 in an area in which the output matching circuit is not formed. The multi-layered ceramic capacitor 40 includes a lower electrode grounded through the package 50 composed of an electrical conductor, and an upper electrode electrically connected to the output matching circuit through the bonding wire 41.

As an alternative, the dielectric substrate 46 which defines the impedance line 46 may be formed with a through-hole 52 reaching a lower surface of the package 50, and the multi-layered ceramic capacitor 40 may be formed on the dielectric substrate 46 such that a lower electrode of the multi-layered ceramic capacitor 40 is located above the through-hole 52.

In the micro-wave power amplifier in accordance with the second embodiment, the LC series resonance circuits having resonance frequencies different from one another are electrically connected to the gate electrode terminal 2 and the drain electrode terminal 3 in the field effect transistor 1, ensuring that a low frequency impedance can be sufficiently lowered at the input- and output-sides of the field effect transistor 1 in a wide band without any harmful influence or loss to a frequency of a fundamental wave.

The micro-wave power amplifier in accordance with the second embodiment could have suitable distortion characteristic in a wide band.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-366517 filed on Dec. 1, 2000 including specification, claims, drawings and summary is incorporated herein by reference in its entirety.

What is claimed is:

1. A micro-wave power amplifier which amplifies a micro-wave signal including a plurality of carrier frequencies different from one another, comprising:

(a) a field effect transistor having a grounded source;

(b) a first difference frequency circuit which is electrically connected to a drain of said field effect transistor, and is short-circuited at a difference frequency between said carrier frequencies; and (e) a second difference frequency circuit which is electrically connected to a gate of said field effect transistor, and is short-circuited at a difference frequency between said carrier frequencies.

2. The micro-wave power amplifier as set forth in claim 1, wherein said first difference frequency circuit is comprised of:

(b1) an inductor which is electrically connected to a drain of said field effect transistor; and (b2) a capacitor which is electrically connected at one end to said inductor, and is grounded at the other end.

3. The micro-wave power amplifier as set forth in claim 1, wherein said second difference frequency circuit is comprised of:

(c1) an inductor which is electrically connected to a gate of said field effect transistor; and (c2) a capacitor which is electrically connected at one end to said inductor, and is grounded at the other end.

4. The micro-wave power amplifier as set forth in claim 1, wherein said first difference frequency circuit is comprised of a plurality of third difference frequency circuits, each of said third difference frequency circuits being comprised of:

an inductor which is electrically connected to a drain of said field effect transistor; and a capacitor which is electrically connected at one end to said inductor, and is grounded at the other end, an inductance of said inductor and a capacity of said capacitor being determined such that said third difference frequency circuits are resonated with one another at said difference frequency.

5. The micro-wave power amplifier as set forth in claim 1, wherein said second difference frequency circuit is comprised of a plurality of third difference frequency circuits, each of said third difference frequency circuits being comprised of:

an inductor which is electrically connected to a gate of said field effect transistor; and a capacitor which is electrically connected at one end to said inductor, and is grounded at the other end, an inductance of said inductor and a capacity of said capacitor being determined such that said third difference frequency circuits are resonated with one another at said difference frequency.

6. The micro-wave power amplifier as set forth in claim 2, wherein said inductor is comprised of a bonding wire.

7. The micro-wave power amplifier as set forth in claim 3, wherein said inductor is comprised of a bonding wire.

8. The micro-wave power amplifier as set forth in claim 4, wherein said inductor is comprised of a bonding wire.

9. The micro-wave power amplifier as set forth in claim 5, wherein said inductor is comprised of a bonding wire.

10. The micro-wave power amplifier as set forth in claim 2, wherein said capacitor is comprised of a multi-layered ceramic capacitor.

11. The micro-wave power amplifier as set forth in claim 3, wherein said capacitor is comprised of a multi-layered ceramic capacitor.

12. The micro-wave power amplifier as set forth in claim 4, wherein said capacitor is comprised of a multi-layered ceramic capacitor.

13. The micro-wave power amplifier as set forth in claim 5, wherein said capacitor is comprised of a multi-layered ceramic capacitor.

* * * * *